United States Patent
Disney et al.

(10) Patent No.: US 8,084,811 B2
(45) Date of Patent: Dec. 27, 2011

(54) POWER DEVICES WITH SUPER JUNCTIONS AND ASSOCIATED METHODS MANUFACTURING

(75) Inventors: Donald R. Disney, Cupertino, CA (US); Michael R. Hsing, Saratoga, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 156 days.

(21) Appl. No.: 12/576,150

(22) Filed: Oct. 8, 2009

(65) Prior Publication Data

US 2011/0084333 A1 Apr. 14, 2011

(51) Int. Cl.
*H01L 29/66* (2006.01)

(52) U.S. Cl. ........ 257/329; 438/137; 438/138; 438/156; 438/173; 257/60; 257/E21.018; 257/E21.036; 257/E21.41

(58) Field of Classification Search .......... 438/137–138, 438/156, 173, 192, 268–270, 424, 478; 257/60, 257/135, 242, 263, 283, 302, 374, 397, 329–334, 257/513–514, 622, 647–648, E21.018, E21.036, 257/E21.233, E21.375, E21.383, E21.41, 257/E21.447, E29.262
See application file for complete search history.

(56) References Cited

U.S. PATENT DOCUMENTS

| | | | | |
|---|---|---|---|---|
| 4,941,026 | A * | 7/1990 | Temple ........................ | 257/333 |
| 5,592,015 | A * | 1/1997 | Iida et al. ..................... | 257/524 |
| 6,184,555 | B1 * | 2/2001 | Tihanyi et al. ................ | 257/342 |
| 6,337,499 | B1 * | 1/2002 | Werner ......................... | 257/329 |
| 6,410,958 | B1 * | 6/2002 | Usui et al. .................... | 257/329 |
| 6,495,421 | B2 * | 12/2002 | Luo ............................... | 438/269 |
| 6,541,817 | B1 * | 4/2003 | Hurkx et al. .................. | 257/330 |
| 6,750,524 | B2 * | 6/2004 | Parthasarthy et al. ........ | 257/492 |
| 6,762,112 | B2 * | 7/2004 | Raineri et al. ................ | 438/424 |
| 6,919,241 | B2 * | 7/2005 | Kinzer et al. ................. | 438/194 |
| 7,052,982 | B2 * | 5/2006 | Hshieh et al. ................. | 438/525 |
| 7,253,477 | B2 * | 8/2007 | Loechelt et al. .............. | 257/341 |
| 7,394,144 | B2 * | 7/2008 | Rochefort et al. ............ | 257/522 |
| 7,423,315 | B2 * | 9/2008 | Okumura et al. ............. | 257/328 |
| 7,436,023 | B2 * | 10/2008 | Hirler et al. ................... | 257/328 |
| 7,439,583 | B2 * | 10/2008 | Hshieh .......................... | 257/341 |
| 7,504,305 | B2 * | 3/2009 | Blanchard ..................... | 438/270 |
| 7,723,172 | B2 * | 5/2010 | Ishiguro ........................ | 438/207 |
| 7,816,759 | B2 * | 10/2010 | Tilke ............................. | 257/506 |
| 7,893,491 | B2 * | 2/2011 | deFresart ...................... | 257/341 |
| 7,897,998 | B2 * | 3/2011 | Beach ........................... | 257/168 |
| 7,936,010 | B2 * | 5/2011 | Zundel et al. ................. | 257/330 |
| 7,936,015 | B2 * | 5/2011 | Tokano et al. ................ | 257/341 |
| 2002/0127831 | A1 * | 9/2002 | Hadizad et al. ............... | 438/510 |
| 2004/0012038 | A1 * | 1/2004 | Kouzuki et al. ............... | 257/200 |
| 2004/0238844 | A1 * | 12/2004 | Tokano et al. ................ | 257/197 |
| 2005/0181564 | A1 * | 8/2005 | Hshieh et al. ................. | 438/270 |
| 2005/0181577 | A1 * | 8/2005 | Hshieh .......................... | 438/427 |
| 2006/0134867 | A1 * | 6/2006 | Blanchard ..................... | 438/270 |

(Continued)

*Primary Examiner* — N Drew Richards
*Assistant Examiner* — Ankush Singal
(74) *Attorney, Agent, or Firm* — Perkins Coie LLP (57) ABSTRACT

Power devices with super junctions and associated methods of manufacturing are disclosed herein. In one embodiment, a method for forming a power device includes forming an epitaxial layer on a substrate material and forming a trench in the epitaxial layer. The trench has a first sidewall, a second sidewall, and a bottom between the first and second sidewalls. The method also includes forming an insulation material on at least one of the first and second sidewalls of the trench and diffusing a dopant into the epitaxial layer via at least one of the first and second sidewalls of the trench via the insulation material.

12 Claims, 7 Drawing Sheets

U.S. PATENT DOCUMENTS

| | | | |
|---|---|---|---|
| 2006/0226494 A1* | 10/2006 | Hshieh ........................... | 257/369 |
| 2006/0249786 A1* | 11/2006 | Moens et al. .................. | 257/328 |
| 2007/0072398 A1* | 3/2007 | Shibata et al. ................. | 438/478 |
| 2007/0108512 A1* | 5/2007 | Sedlmaier et al. ............. | 257/328 |
| 2008/0048175 A1* | 2/2008 | de Fresart ....................... | 257/19 |
| 2008/0272429 A1* | 11/2008 | Ishiguro ......................... | 257/330 |
| 2009/0117700 A1* | 5/2009 | Lin et al. ........................ | 438/270 |
| 2009/0121285 A1* | 5/2009 | Kawamura et al. ............ | 257/330 |
| 2009/0130806 A1* | 5/2009 | Sedlmaier et al. ............. | 438/192 |
| 2010/0038675 A1* | 2/2010 | Yoshikawa ..................... | 257/142 |
| 2010/0044792 A1* | 2/2010 | Hebert ........................... | 257/341 |
| 2010/0065908 A1* | 3/2010 | Moens et al. .................. | 257/334 |
| 2010/0140657 A1* | 6/2010 | Takei ............................. | 257/139 |
| 2010/0200910 A1* | 8/2010 | Yedinak et al. ................ | 257/328 |
| 2011/0006304 A1* | 1/2011 | Xiao et al. ...................... | 257/49 |

* cited by examiner

POWER DEVICES WITH SUPER JUNCTIONS AND ASSOCIATED METHODS MANUFACTURING

TECHNICAL FIELD

The current technology is related generally to power devices and associated methods of manufacturing. In particular, the current technology is related generally to vertical metal-oxide field effect transistors (MOSFET) and associated methods of manufacturing.

BACKGROUND

Vertical MOSFET generally have superior power switching performance when compared to conventional bipolar devices. However, the on-state resistance of power MOSFET increases sharply as breakdown voltage increases. As a result, vertical MOSFET may be unusable in high voltage applications.

Figure 1:
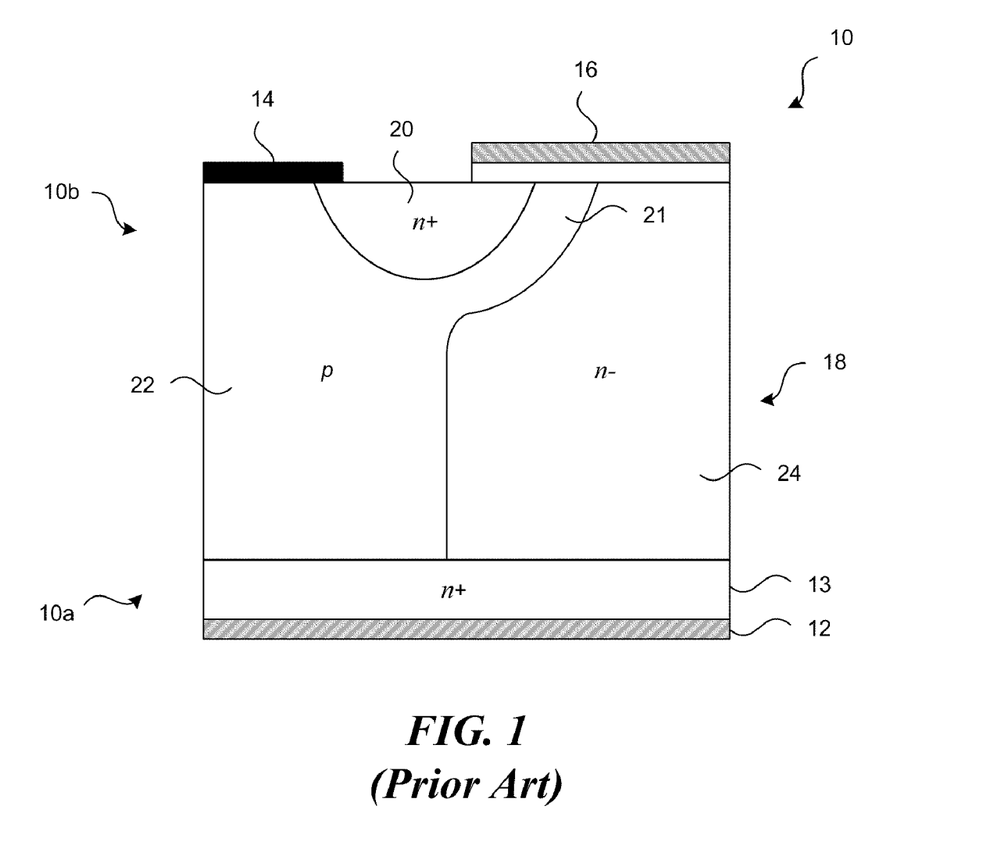
FIG. 1 is a partially schematic cross-sectional view of a vertical MOSFET in accordance with the prior art.

One solution for achieving lower on-state resistance while maintaining reasonable breakdown voltage is by utilizing "super junctions." FIG. 1 schematically illustrates a conventional n-type vertical MOSFET 10 with super junctions. As shown in FIG. 1, the MOSFET 10 includes a drain electrode 12 coupled to an n-type drain 13 at a first end 10a, a source electrode 14 coupled to an n-type source 20, and a gate 16 spaced apart from the drain electrode 12 at a second end 10b, and a drift region 18 between the first and second ends 10a and 10b. The MOSFET 10 also includes a p-type well 21 proximate to the source 14 electrode and the gate 16, forming the body region of the field effect transistor.

The drift region 18 includes a p-type pillar 22 juxtaposed with an n-type pillar 24 forming a "super junction." The p-type pillar 22 and the n-type pillar 24 are doped with select ion concentrations such that these two pillars at least approximately deplete each other laterally. As a result, the MOSFET 10 may have a high break down voltage between the source 14 and the drain 12. In operation, the n-type pillar 24 forms a conduction channel between the drain 12 and the source 14. Compared with conventional power MOSFET, the n-type pillar 24 may be doped with higher concentrations and thus may have a low on-state resistance. Even though MOSFET with super junctions have many performance advantages, the manufacturing of such devices can be costly and imprecise. Accordingly, certain improvements are needed for efficiently and cost effectively forming small dimension pillars in vertical MOSFET.

DETAILED DESCRIPTION

Several embodiments of the present technology are described below with reference to vertical MOSFET useful for power switching and associated methods of manufacturing. Many details of certain embodiments are described below with reference to semiconductor substrates. The term "semiconductor substrate" is used throughout to include a variety of articles of manufacture, including, for example, individual integrated circuit dies, sensor dies, switch dies, and/or dies having other semiconductor features. The term "photoresist" generally refers to a material that can be chemically modified when exposed to electromagnetic radiation. The term encompasses both positive photoresist configured to be soluble when activated by the electromagnetic radiation and negative photoresist configured to be insoluble when activated by light. Many specific details of certain embodiments are set forth in FIGS. 2A-5 and in the following text to provide a thorough understanding of these embodiments. Several other embodiments can have configurations, components, and/or process operations different than those described in this disclosure. One of ordinary skill in the relevant art, therefore, will appreciate that additional embodiments may be practiced without several of the details of the embodiments shown in FIGS. 2A-5.

FIGS. 2A-2G are partially schematic cross-sectional views of a semiconductor substrate 100 undergoing a process for forming a vertical MOSFET in accordance with embodiments of the technology. In the following discussion, the semiconductor substrate 100 includes an n-type substrate material 102 for illustration purposes. One of ordinary skill in the art will understand that embodiments of the process may also include a p-type substrate material or an intrinsic (i.e., non-doped) substrate material in lieu of the n-type substrate material 102.

In the illustrated embodiment in FIGS. 2A-2G, the semiconductor substrate 100 includes a first n-type substrate material (or a drain) 102 and an optional second n-type substrate material (or a buffer region) 104. The first n-type substrate has a first dopant concentration, and the second n-type substrate material 104 has a second dopant concentration lower than the first dopant concentration. In certain embodiments, the optional second n-type substrate material 104 may be deposited as an n-type epitaxial layer on the first n-type substrate material 102. In other embodiments, the first and second n-type substrate materials 102 and 104 may be formed via diffusion, implantation, and/or other suitable techniques. In further embodiments, the second n-type substrate material 104 may be omitted.

Figure 3A:
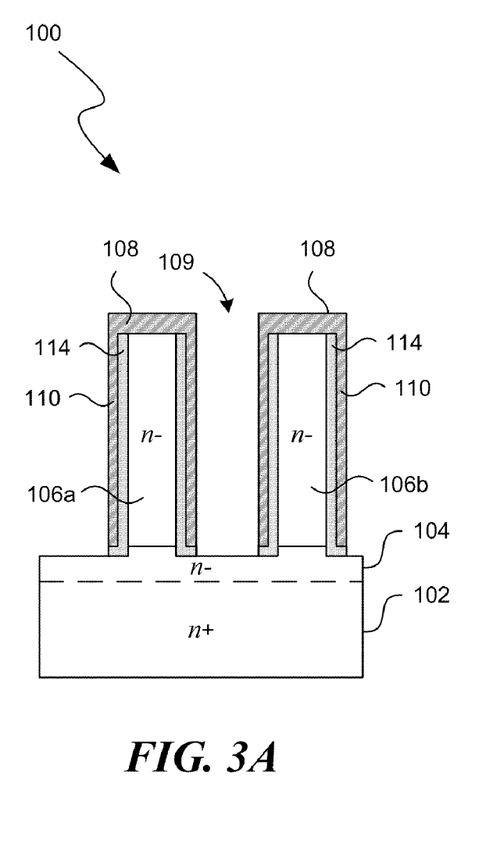
FIGS. 3A and 3B are partially schematic cross-sectional views of a semiconductor substrate undergoing another process for forming a vertical MOSFET in accordance with embodiments of the technology.

As shown in FIG. 3A, the process includes depositing an n-type epitaxial layer 106 onto the optional second substrate material 104 via chemical vapor deposition (CVD), plasma enhanced chemical vapor deposition (PECVD), atomic layer deposition (ALD), liquid phase epitaxy, and/or other suitable deposition techniques. The term "epitaxial layer" as used hereinafter generally refers to a mono-crystalline film or layer on a mono-crystalline substrate material. For example, the n-type epitaxial layer 106 may include a mono-crystalline silicon layer or other suitable semiconductor material doped with Phosphorus (P), Arsenic (As), Antimony (Sb), and/or other suitable n-type dopant. In one embodiment, the n-type epitaxial layer 106 has a dopant concentration that is generally the same as the optional second substrate material 104. In other embodiments, the n-type epitaxial layer 106 may have other desired dopant concentrations.

Figure 2A:
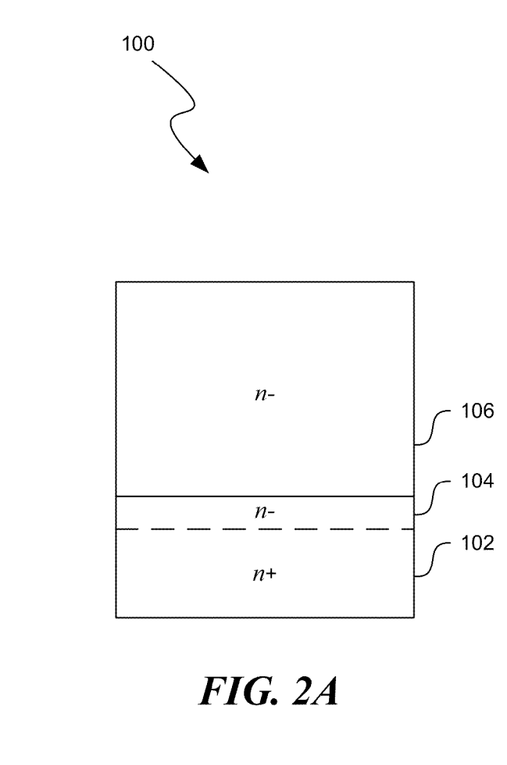
FIGS. 2A-2G are partially schematic cross-sectional views of a semiconductor substrate undergoing a process for forming a vertical MOSFET in accordance with embodiments of the technology.
Figure 2B:
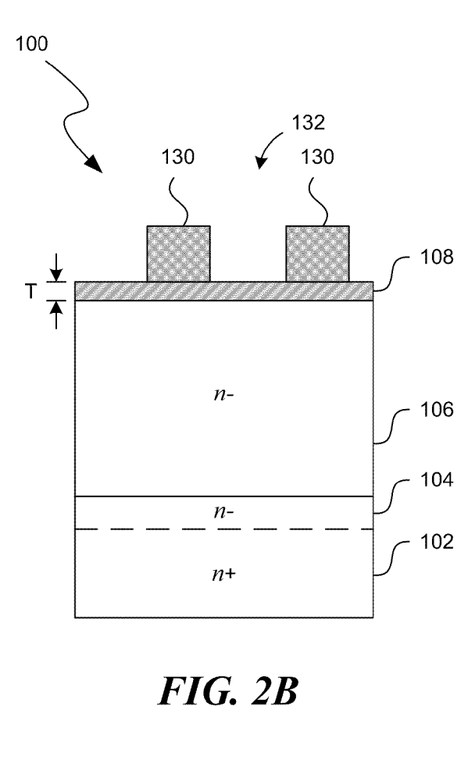

After depositing the epitaxial layer 106, the process includes forming a first insulation material 108 with a thickness T (e.g., about 1,000 to about 1,500 Angstroms) on the epitaxial layer 106 as shown in FIG. 2B. In one embodiment, the first insulation material 108 can include silicon dioxide formed by chemical vapor deposition (CVD), thermal oxidation, and/or other suitable techniques. In other embodiments, the first insulation material 108 can also include spin-on glass, flowable oxide, organic materials (e.g., a resin), and/or other suitable materials that has a low rate of dopant diffusion therein.

After forming the first insulation material 108, the process includes depositing a photoresist 130 onto the first insulation material 108 via spin coating and/or other suitable techniques. The photoresist 130 may then be patterned to form openings 132 in the photoresist 130. The term "patterning" as used hereinafter generally refers to printing a desired pattern on a photoresist and subsequently removing certain portions of the photoresist to form the desired pattern in the photoresist using photolithography and/or other suitable techniques. Even though one opening 132 is shown in FIG. 2B, in certain embodiments, the photoresist 130 may include any desired number of openings.

Figure 2C:
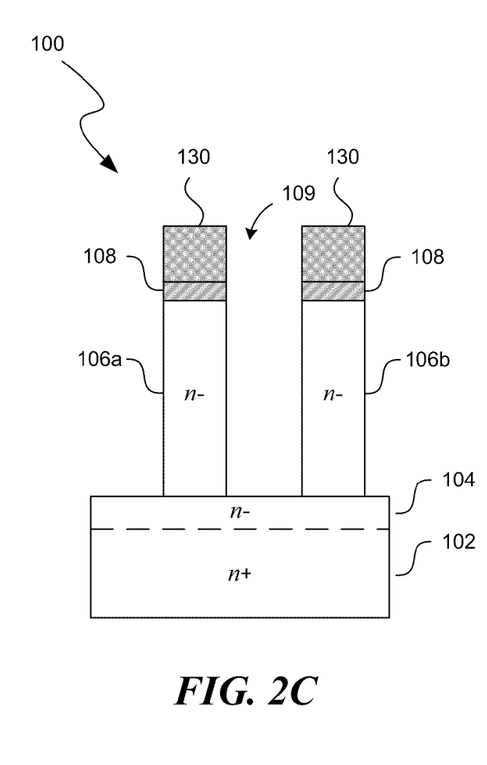

As shown in FIG. 2C, the process includes removing portions of first insulation material 108 and the epitaxial layer 106 and thereby forming a first n-type pillar 106a separated from a second n-type pillar 106b by a channel 109. Each of the first and second n-type pillars 106a and 106b include a corresponding first insulation material 108a and 108b, respectively. In the illustrated embodiment, the optional second substrate material 104 is exposed in the channel 109. In other embodiments, the channel 109 may extend into the optional second substrate material 104 and/or the first substrate material 102. Even though two n-type pillars 106a and 106b are shown in FIG. 2C, in certain embodiments, one, three, or any other number of n-type pillars may be formed.

Figure 2D:
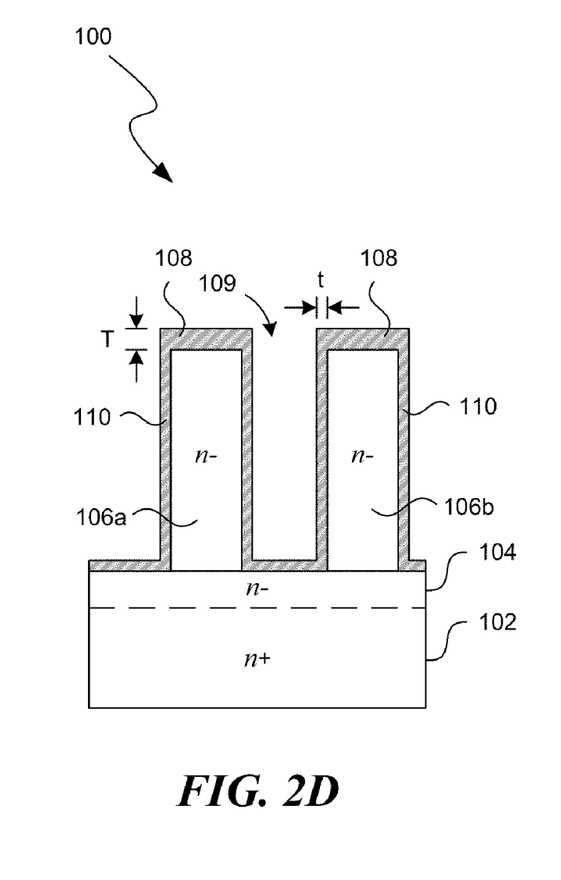

As shown in FIG. 2D, the process further includes forming a second insulation material 110 with a thickness t (e.g., about 100 to about 150 angstroms) on the sidewalls of the n-type pillars 106a and 106b, and the exposed substrate material at the bottom of channel 109. In one embodiment, the second insulation material 110 is thermally grown silicon dioxide. In other embodiments, the second insulation material 110 can include silicon dioxide, spin-on glass, flowable oxide, organic materials (e.g., a resin), and/or other suitable materials. In the illustrated embodiment, the second insulation material 110 may include the same material as the first insulation material 108. As a result, the first and second insulation materials 108 and 110 may merge into a single insulation material. In other embodiments, the second insulation material 110 may include a different material than the first insulation material 108.

Figure 2E:
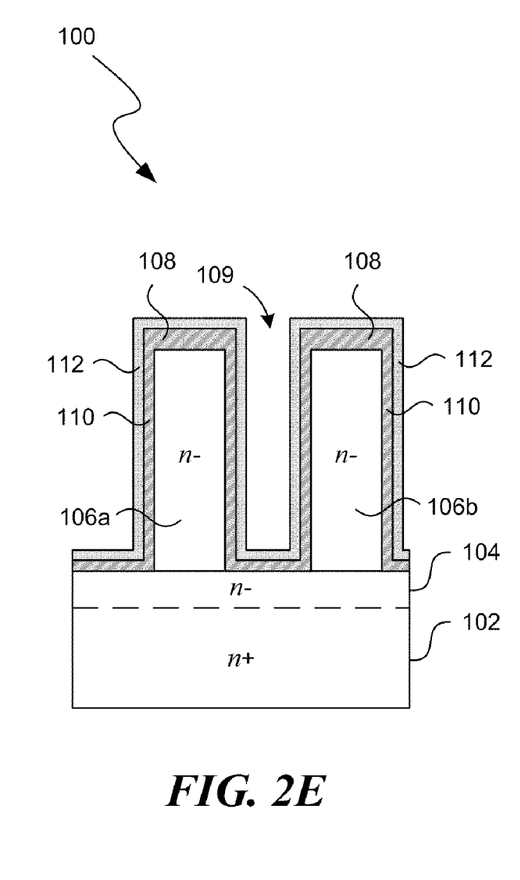

As shown in FIG. 2E, the process includes depositing a doping material 112 carrying a select dopant onto the second insulation material 110. In one embodiment, depositing the doping material 112 can include depositing polysilicon doped with Boron (B), Aluminum (Al), Gallium (Ga), Indium (In), Thallium (Ti), and/or other suitable p-type dopant via low pressure CVD, atomic layer deposition (ALD), and/or other suitable techniques. In other embodiments, the doping material 112 can include other suitable materials carrying other suitable dopant.

Figure 2F:
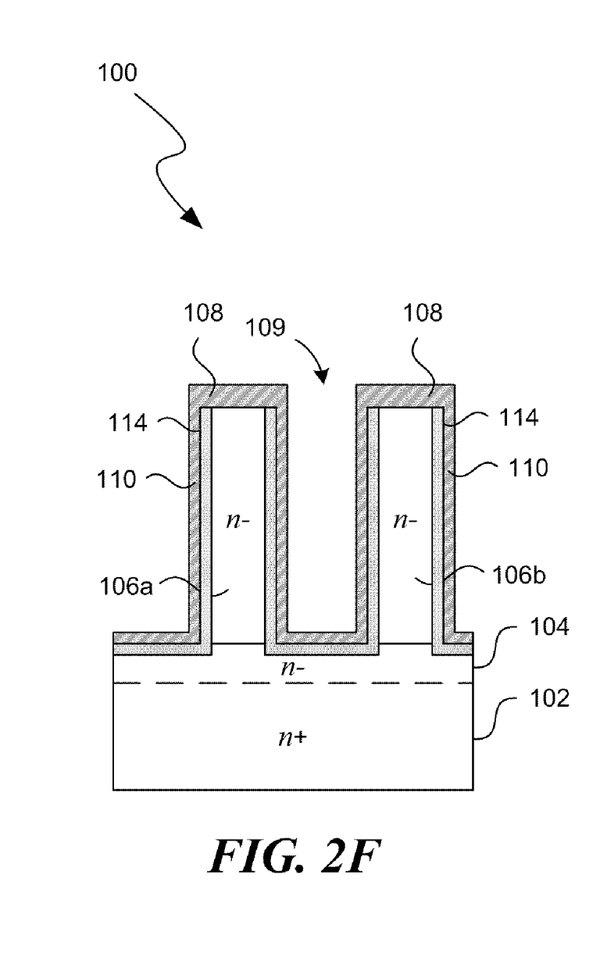

As shown in FIG. 2F, in the illustrated embodiment, the process further includes diffusing the p-type dopant in the doping material 112 into the sidewalls of the n-type pillars 106a and 106b via the second insulation material 110. In the illustrated embodiment, the first insulation material 108a and 108b has a thickness greater than the second insulation material 110. As a result, p-type dopant is diffused into the sidewalls of the n-type pillars to form p-type pillars 114 (identified individually as first to fourth p-type pillars 114a-114d, respectively) between the second insulation material 110 and the n-type pillars 106a and 106b.

In one embodiment, diffusing the p-type dopant in the doping material 112 includes heating the substrate 100 to a temperature (e.g., 1,000° C.) for a period of time (e.g., 120 minutes). In other embodiments, diffusing the p-type dopant in the doping material 112 may include irradiation the substrate 100 and/or via other suitable technique. Subsequently, the doping material 112 may be removed via wet etching, dry etching, and/or other suitable techniques.

Figure 2G:
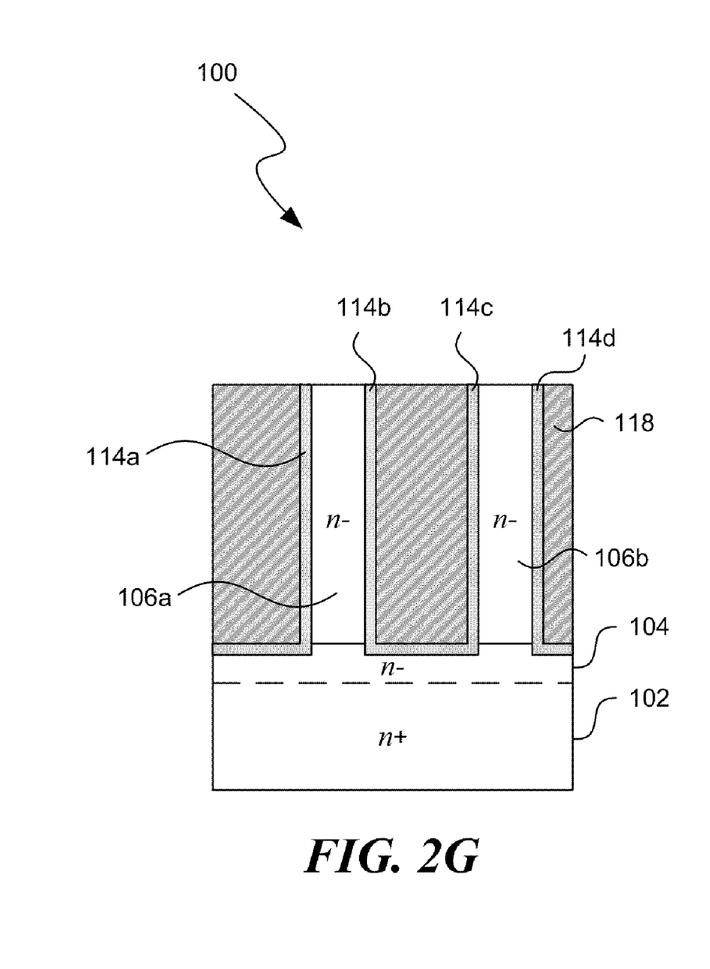

As shown in FIG. 2G, the process can further include depositing a third insulation material 118 onto the second insulation material 110 and in the channel 109 (FIG. 2F) and subsequently polishing excess third insulation material 118 to expose an end of the n-type pillars 106a and 106b. In the illustrated embodiment, the third insulation material 118 includes the same material as the second insulation material 110. As a result, the second insulation material 110 is shown in FIG. 2G in phantom lines because the second and third insulation materials 110 and 118 are merged. In other embodiments, the third insulation material 118 may include different materials than the second insulation material 110. The process can further include forming a source, a gate, a drain, and/or other suitable components to form a vertical MOSFET generally similar in structure as the MOSFET 10 in FIG. 1.

Several embodiments of the process discussed above with reference to FIGS. 2A-2G have improved controllability for dopant concentrations in the p-type pillars 114. In accordance with certain conventional techniques, a doped polysilicon material is deposited directly onto the sidewalls of the n-type pillars without any insulation material therebetween. Without being bound by theory, it is believed that the direct contact between the doped polysilicon material and the n-type pillars causes the resulting dopant concentrations in the p-type pillars to be quite sensitive to the dopant concentration in the polysilicon and the diffusion time and temperature, and thus difficult to control. In several embodiments of the foregoing process, by separating the doping material 112 and the n-type pillars 106a and 106b, the dopant diffusion process becomes less sensitive to diffusion time and/or temperature and may be controlled by adjusting the thickness of the second insulation material 110 (e.g., thermally grown oxide). Accordingly, the controllability of dopant concentrations in the p-type pillars may be improved.

An additional feature of several embodiments of the process is that the polysilicon may be removed with an inexpensive technique (e.g., wet etching) because the second insulation material 110 may act as a stop for the wet etching operation. For example, a wet etchant (e.g., TMAH) that can etch silicon and polysilicon much faster than silicon dioxide may be used to remove the polysilicon in an expensive and repeatable manner.

Figure 3B:
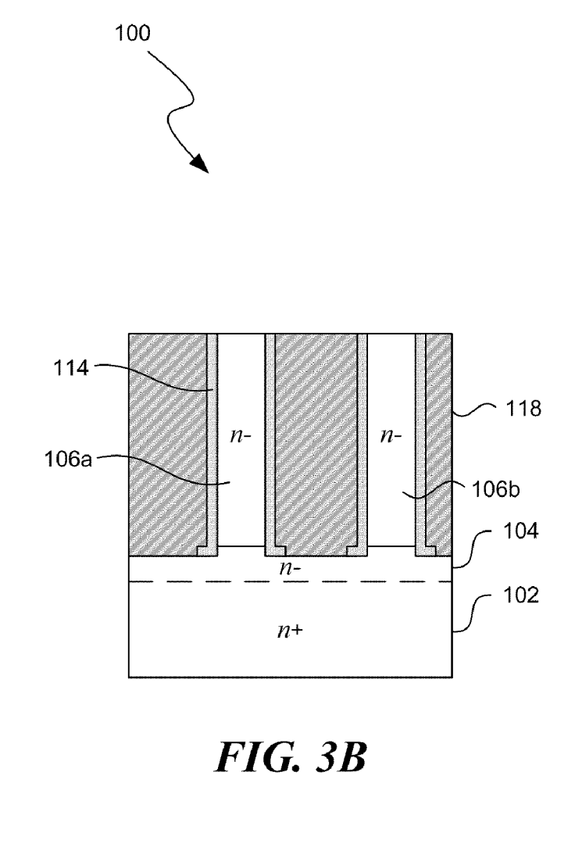

Even though FIGS. 2F and 2G show laterally extending p-type dopant in the optional second n-type substrate material 104, in certain embodiments, at least a portion of the laterally extending p-type dopant may be removed. For example, as shown in FIG. 3A, after removing the doping material 112 in FIG. 2F, in certain embodiments, the process can include trench etching the optional second n-type substrate material 104 to remove at least a portion of the laterally extending p-type dopant. Such trench etching operation may be performed without any photolithography mask, but instead, using RIE etch and/or other suitable techniques that can etch silicon faster than the first and second insulation materials 108 and 110. Subsequently, the process can include depositing the third insulation material 118 onto the second insulation material 110 and in the channel 109 (FIG. 2F) and polishing excess third insulation material 118 to expose an end of the n-type pillars 106a and 106b, as shown in FIG. 3B.

Figure 4A:
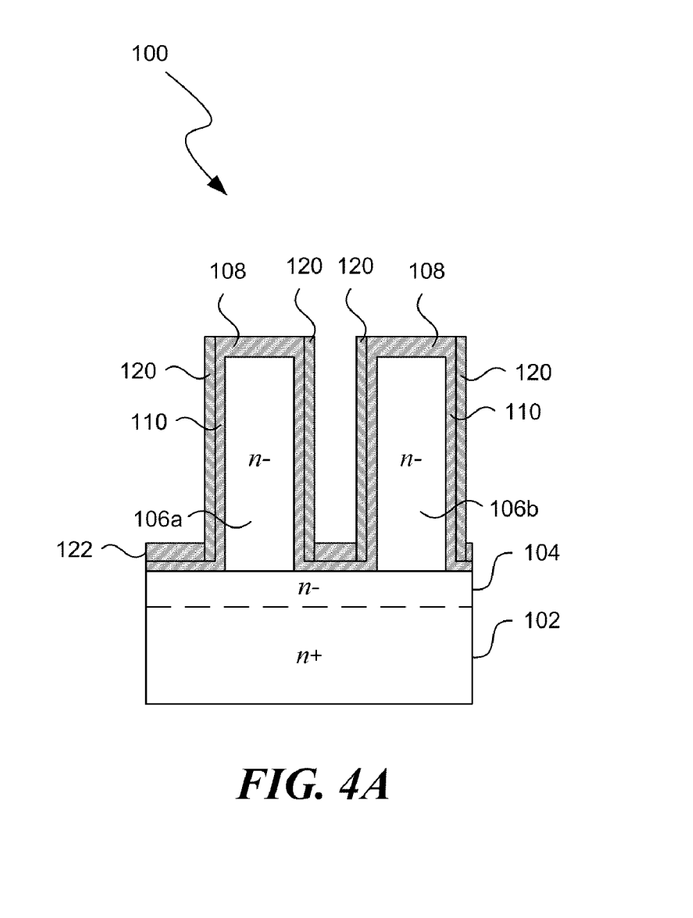
FIGS. 4A and 4B are partially schematic cross-sectional views of a semiconductor substrate undergoing a further process for forming a vertical MOSFET in accordance with embodiments of the technology.

In other embodiments, the process may include preventing the laterally extending p-type dopant from being formed during the dopant diffusion operation. For example, as shown in FIG. 4A, after forming the second insulation material 110 as shown in FIG. 2D, in certain embodiments, the process can include depositing a barrier material 120 (e.g., silicon nitride) onto the second insulation material 110. The barrier material 120 can then be etched without using a photolithography mask (e.g., by using an anisotropic etching technique and/or other suitable techniques) that substantially removes the barrier material 120 only from the horizontal surfaces. This anisotropic etch operation may also have a lower etching rate for the insulation material 108 and 110 than for the barrier material 120. The laterally extending portion of the barrier material 120 is thus removed from the bottom of the channel 109.

Then the process can include increasing a thickness of the laterally extending portion 122 of the second insulation material 110, e.g., via a thermal oxidation operation. Thermal oxidation of the sidewalls is at least reduced or prevented by the barrier material 120 so that the thickness of the second insulation material 110 is not increased on the sidewalls. The thickness of the second insulation material 110 at the bottom of channel 109 may be large enough (e.g., about 400 Å to about 1000 Å) to at least reduce or substantially prevent diffusion of any dopant from the doping material 112 toward the optional second substrate material 104.

Figure 4B:
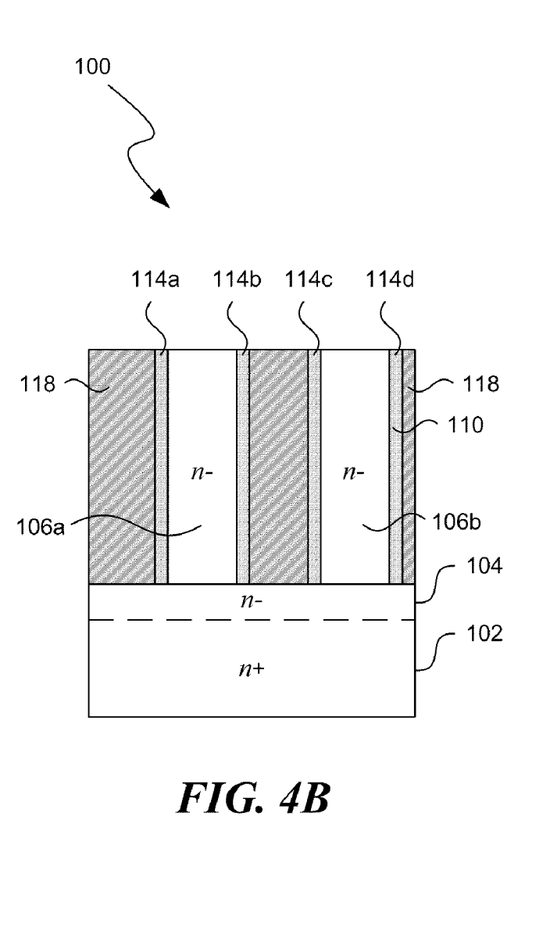

Subsequently, the barrier material 120 may be removed before the process continues to depositing the doping material 112 as shown in FIG. 2E. For example, a wet etch may be used to remove the barrier material 112 containing silicon nitride without substantially etching the underlying insulation material. After subsequent operations as discussed with reference to FIGS. 2F and 2G, the p-type pillars 114 without laterally extending portions may be formed as shown in FIG. 4B without the laterally extending portions because the increased thickness of the laterally extending portion of the second insulation material 110 is believed to reduce or prevent the p-type dopant from diffusing through.

Figure 5:
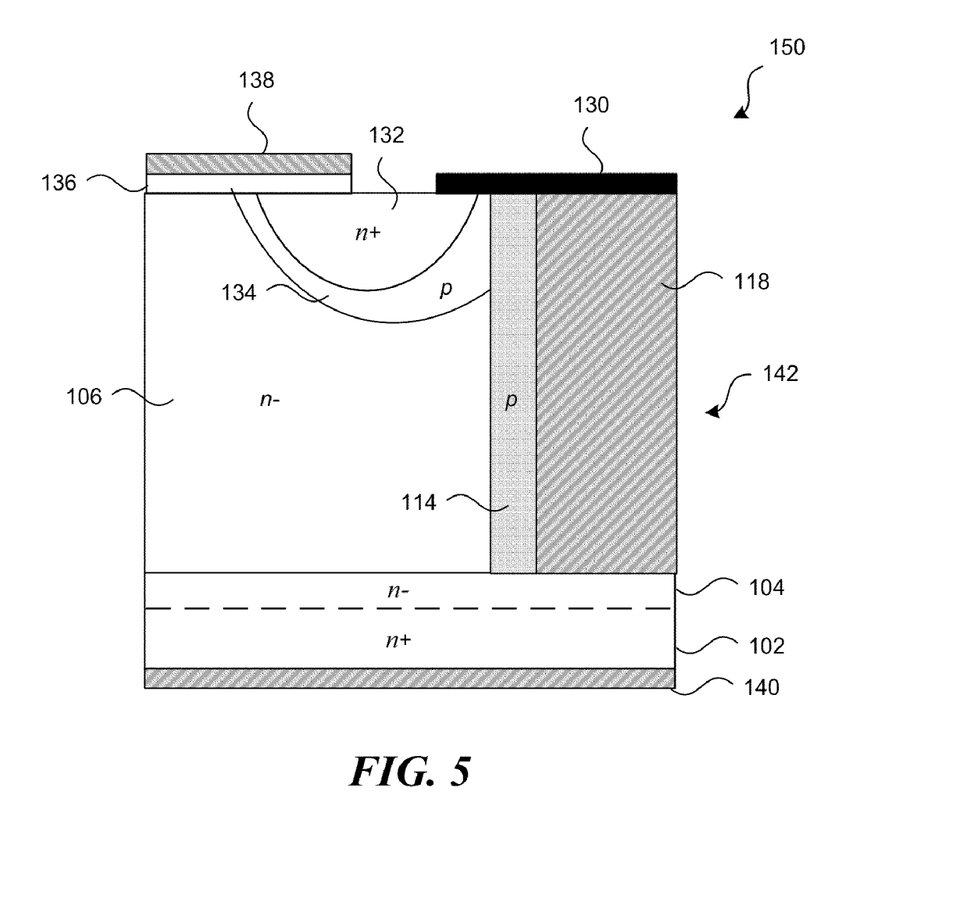
FIG. 5 is a partially schematic cross-sectional view of a vertical MOSFET formed according to certain embodiments of the technology.

FIG. 5 is a schematic diagram of a vertical MOSFET 150 formed according to several embodiments of the foregoing process. As shown in FIG. 5, In the illustrated embodiment, the MOSFET 150 includes a drain electrode 140 coupled to an n-type drain 120 having an n+ substrate with a resistivity in the range of about 0.001 ohm-cm to about 0.1 ohm-cm. The drain electrode 140 is formed on the bottom of the drain 102. Optional n-type layer 104 is formed on the drain 102 and has a thickness in the range of about 1 micron to about 10 microns and a doping concentration in the range of about $1\times10^{14}$ to about $1\times10^{16}$ cm$^{-3}$. A drift region 142 is formed on the n-type layer 104. A source electrode 130 is coupled to an n-type source 132 and a p-type body 134. A gate 138 is formed on gate oxide 136 and spaced apart from the source electrode 130.

The drift region 142 includes a p-type pillar 114 juxtaposed with an n-type pillar 106, forming a "super junction." The p-type pillar 114 and the n-type pillar 106 are doped with select ion concentrations such that these two pillars at least approximately deplete each other laterally. For example, the integrated charge in the horizontal direction may be in the range of about $1\times10^{12}$ to about $2\times10^{12}$ cm$^{-2}$.

An insulating region 118 is also juxtaposed with the p-type pillar 114. The insulating region 118 can include a dielectric material and thus does not contribute any charge and does not affect the charge balance of the drift region 142. As a result, the MOSFET 150 has a high breakdown voltage between the source 132 and the drain 102. In on-state operation, the n-type pillar 106 and a conduction channel across the p-type body 134 form a conduction channel between the drain 102 and the source 132.

One feature of several embodiments of the MOSFET 150 is the absence of any p-type doping below the insulating region 118. The presence of any p-type doping in this area may upset the charge balance between the n-type and p-type pillars 106 and 114 in the drift region 142. To at least reduce the problem, prior art trench-based super junction MOSFET devices have typically extended the p-type pillars all the way down to the heavily doped drain region. In the MOSFET 150, however, a lightly-doped n-type layer 104 may be present between the bottom of the p-type pillar 114 and the drain 102, which may allow for better optimization of the MOSFET device performance.

From the foregoing, it will be appreciated that specific embodiments of the technology have been described herein for purposes of illustration. However, various modifications may be made without deviating from the disclosure. Many of the elements of one embodiment may be combined with other embodiments in addition to or in lieu of the elements of the other embodiments. Accordingly, the disclosure is not limited except as by the appended claims.

We claim:

1. A method for forming a power device, comprising:
   forming an epitaxial layer on a substrate material;
   selectively removing a portion of the epitaxial layer to form a column extending from the substrate material, the column having a sidewall;
   forming an insulation material on the sidewall of the column; and
   diffusing a dopant into the sidewall of the column via the insulation material, wherein:
   forming an epitaxial layer includes forming an n-type epitaxial layer on an n-type substrate material;
   the insulating material is a first insulation material having a first thickness;
   the method further includes forming a second insulation material onto an exposed surface of the column, the second insulation material having a second thickness greater than the first thickness, wherein the first and second insulation materials include at least one of silicon dioxide, spin-on glass, and flowable oxide;
   selectively removing a portion of the epitaxial layer includes:
     depositing a photoresist onto the second insulation material;
     patterning the deposited photoresist to form an opening in the photoresist;
     removing material from the second insulation material and the epitaxial layer via the opening; and
   diffusing a dopant includes:
     depositing a polysilicon material on the first and second insulation materials, the polysilicon being doped with a p-type dopant; and
     diffusing the p-type dopant of the polysilicon into the sidewall of the column via the first insulation material while the second insulation material prevents the p-type dopant from diffusing into the surface of the column.

2. A method for forming a power device, comprising:
forming an epitaxial layer on a substrate material;
selectively removing a portion of the epitaxial layer to form a column extending from the substrate material, the column having a sidewall;
forming an insulation material on the sidewall of the column; and
diffusing a dopant into the sidewall of the column via the insulation material, wherein diffusing a dopant includes:
depositing a doping material on the insulation material, the doping material carrying a dopant; and
diffusing the dopant carried by the doping material into the sidewall of the column via the insulation material.

3. A method for forming a power device, comprising:
forming an epitaxial layer on a substrate material;
selectively removing a portion of the epitaxial layer to form a column extending from the substrate material, the column having a sidewall;
forming an insulation material on the sidewall of the column; and
diffusing a dopant into the sidewall of the column via the insulation material, wherein diffusing a dopant includes:
depositing a polysilicon material on the insulation material, the polysilicon material being doped with a p-type dopant; and
diffusing the p-type dopant carried by the polysilicon material into the sidewall of the column via the insulation material.

4. A method for forming a power device, comprising:
forming an epitaxial layer on a substrate material;
selectively removing a portion of the epitaxial layer to form a column extending from the substrate material, the column having a sidewall;
forming an insulation material on the sidewall of the column; and
diffusing a dopant into the sidewall of the column via the insulation material, wherein:
the insulating material is a first insulation material;
the method further includes forming a second insulation material onto an exposed surface of the column;
diffusing a dopant includes:
  depositing a doping material on the insulation material, the doping material carrying a dopant; and
  diffusing the dopant carried by the doping material into the sidewall of the column via the first insulation material while the second insulation material prevents the dopant from diffusing into the surface of the column.

5. A method for forming a power device, comprising:
forming an epitaxial layer on a substrate material;
selectively removing a portion of the epitaxial layer to form a column extending from the substrate material, the column having a sidewall;
forming an insulation material on the sidewall of the column; and
diffusing a dopant into the sidewall of the column via the insulation material, wherein:
the insulating material is a first insulation material;
the method further includes forming a second insulation material onto an exposed surface of the column;
diffusing a dopant includes:
depositing a polysilicon material on the insulation material, the polysilicon material being doped with a p-type dopant; and
diffusing the p-type dopant carried by the polysilicon material into the sidewall of the column via the first insulation material while the second insulation material prevents the p-type dopant from diffusing into the surface of the column.

6. A method for forming a power device, comprising:
forming an epitaxial layer on a substrate material;
selectively removing a portion of the epitaxial layer to form a column extending from the substrate material, the column having a sidewall;
forming an insulation material on the sidewall of the column; and
diffusing a dopant into the sidewall of the column via the insulation material, wherein:
the insulating material is a first insulation material;
the method further includes forming a second insulation material onto an exposed surface of the column;
diffusing a dopant includes:
depositing a polysilicon material on the insulation material, the polysilicon material being doped with a p-type dopant;
  diffusing a first portion of the p-type dopant into the sidewall of the column and a second portion of the p-type dopant into the substrate material via the first insulation material while the second insulation material prevents the p-type dopant from diffusing into the surface of the column; and
the method further includes selectively etching the substrate material to remove at least a part of the second portion of the p-type dopant.

7. A method for forming a power device, comprising:
forming an epitaxial layer on a substrate material;
selectively removing a portion of the epitaxial layer to form a column extending from the substrate material, the column having a sidewall;
forming an insulation material on the sidewall of the column; and
diffusing a dopant into the sidewall of the column via the insulation material, wherein forming an insulation material includes:
forming a first portion of the insulation material onto the sidewall of the column and a second portion onto a surface of the substrate material;
the method further includes:
  depositing a barrier material onto the insulation material;
  selectively removing a portion of the barrier material such that the second portion of the insulation material is exposed;
the method further includes increasing a thickness of the second portion of the insulation material;
diffusing a dopant includes diffusing the dopant into the sidewall of the column via the first portion of the insulation material while the second portion of the insulation material prevents the dopant from diffusing into the substrate material.

8. A method for forming a power device, comprising:
forming an epitaxial layer on a substrate material;
forming a trench in the epitaxial layer, the trench having a first sidewall, a second sidewall, and a bottom between the first and second sidewalls;
forming an insulation material on at least one of the first and second sidewalls of the trench; and
diffusing a dopant into the epitaxial layer via at least one of the first and second sidewalls of the trench via the insulation material, wherein diffusing a dopant includes:

depositing a doping material on the insulation material, the doping material carrying a dopant; and diffusing the dopant carried by the doping material into the epitaxial layer via the insulation material.

9. A method for forming a power device, comprising:

forming an epitaxial layer on a substrate material;

forming a trench in the epitaxial layer, the trench having a first sidewall, a second sidewall, and a bottom between the first and second sidewalls;

forming an insulation material on at least one of the first and second sidewalls of the trench; and diffusing a dopant into the epitaxial layer via at least one of the first and second sidewalls of the trench via the insulation material, wherein diffusing a dopant includes:

depositing a polysilicon material on the insulation material, the polysilicon material being doped with a p-type dopant; and diffusing the p-type dopant carried by the polysilicon material into epitaxial layer via the insulation material.

10. A method for forming a power device, comprising:

forming an epitaxial layer on a substrate material;

forming a trench in the epitaxial layer, the trench having a first sidewall, a second sidewall, and a bottom between the first and second sidewalls;

forming an insulation material on at least one of the first and second sidewalls of the trench; and diffusing a dopant into the epitaxial layer via at least one of the first and second sidewalls of the trench via the insulation material, wherein:

the insulating material is a first insulation material;

the epitaxial layer has a first surface in direct contact with the substrate material;

the epitaxial layer has a second surface opposite the first surface;

the method further includes forming a second insulation material onto the second surface of the epitaxial layer;

diffusing a dopant includes:

depositing a doping material on the first and second insulation materials, the doping material carrying a dopant; and diffusing the dopant carried by the doping material into the epitaxial layer via the first insulation material while the second insulation material prevents the dopant from diffusing into the second surface of the epitaxial layer.

11. A method for forming a power device, comprising:

forming an epitaxial layer on a substrate material;

selectively removing a portion of the epitaxial layer to form a column extending from the substrate material, the column having a sidewall;

forming an insulation material on the sidewall of the column; and diffusing a dopant into the sidewall of the column via the insulation material, wherein:

the insulating material is a first insulation material;

the epitaxial layer has a first surface in direct contact with the substrate material;

the epitaxial layer has a second surface opposite the first surface;

the method further includes forming a second insulation material onto the second surface of the epitaxial layer;

diffusing a dopant includes:

depositing a polysilicon material on the first and second insulation materials, the polysilicon material being doped with a p-type dopant; and diffusing the p-type dopant carried by the polysilicon material into the epitaxial layer via the first insulation material while the second insulation material prevents the p-type dopant from diffusing into the second surface of the epitaxial layer.

12. A vertical power device, comprising:

a drain comprising a first semiconductor material of a first conductivity type;

a drift region proximate to the drain, the drift region comprising an n-type pillar, a p-type pillar, and an insulating region juxtaposed with one another;

a body comprising a second semiconductor material of a second conductivity type opposite to the first conductivity type, the body being separated from the drain by the drift region; and a source region of the first conductivity type in the body and spaced apart from the drift region; and a buffer region between the drain and the drift region, wherein the buffer region includes a semiconductor material of the first conductivity type and has a doping concentration that is at least one order of magnitude less than a doping concentration of the drain.

* * * * *